(12) United States Patent
Cui

(10) Patent No.: US 11,114,513 B2
(45) Date of Patent: Sep. 7, 2021

(54) DISPLAY SUBSTRATE, MANUFACTURING METHOD THEREOF, DISPLAY PANEL

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 111 days.

(21) Appl. No.: 16/471,327

(22) PCT Filed: Dec. 5, 2018

(86) PCT No.: PCT/CN2018/119324
§ 371 (c)(1),
(2) Date: Jun. 19, 2019

(87) PCT Pub. No.: WO2019/184430
PCT Pub. Date: Oct. 3, 2019

(65) Prior Publication Data
US 2020/0357868 A1    Nov. 12, 2020

(30) Foreign Application Priority Data
Mar. 27, 2018 (CN) .......................... 201810259260.9

(51) Int. Cl.
| | | |
|---|---|---|
| H01L 27/32 | (2006.01) | |
| H01L 51/50 | (2006.01) | |
| H01L 51/56 | (2006.01) | |

(52) U.S. Cl.
CPC ........ *H01L 27/3246* (2013.01); *H01L 27/326* (2013.01); *H01L 51/5056* (2013.01);
(Continued)

(58) Field of Classification Search
CPC . H01L 27/3246; H01L 27/32; H01L 27/3216; H01L 51/0005; H01L 51/5056;
(Continued)

(56) References Cited

U.S. PATENT DOCUMENTS

| | | | |
|---|---|---|---|
| 9,231,031 B2 * | 1/2016 | Yoshida | .............. H01L 51/5262 |
| 2011/0193476 A1 | 8/2011 | Higo et al. | |

(Continued)

FOREIGN PATENT DOCUMENTS

| | | |
|---|---|---|
| CN | 102148334 A | 8/2011 |
| CN | 102709243 A | 10/2012 |

(Continued)

OTHER PUBLICATIONS

International Search Report and Written Opinion of the International Searching Authority (with English language translation), International Application No. PCT/CN2018/119324, dated Mar. 1, 2019, 11 pp.

(Continued)

*Primary Examiner* — Kyoung Lee
*Assistant Examiner* — Christina A Sylvia
(74) *Attorney, Agent, or Firm* — Myers Bigel, P.A.

(57) ABSTRACT

A display substrate including a base substrate and a pixel defining layer is provided. The pixel defining layer includes a first defining layer and a second defining layer, which define a plurality of lower openings and a plurality of upper openings corresponding to the plurality of lower openings, respectively. An orthographic projection of a bottom surface of each upper opening on the base substrate covers that of a corresponding lower opening on the base substrate, orthographic projections of bottom surfaces of the plurality of upper openings on the base substrate have an equal area. The plurality of lower openings include a first lower opening, a second lower opening and a third lower opening, which form (Continued)

a first cavity, a second cavity and a third cavity respectively together with a corresponding upper opening.

15 Claims, 2 Drawing Sheets

(52) U.S. Cl.
CPC .......... *H01L 51/5088* (2013.01); *H01L 51/56* (2013.01); *H01L 2227/323* (2013.01)

(58) Field of Classification Search
CPC ................ H01L 51/5088; H01L 51/56; H01L 51/5206; H01L 51/0096; H01L 51/5209; H01L 2227/323; Y02E 10/549
See application file for complete search history.

(56) References Cited

U.S. PATENT DOCUMENTS

| | | |
|---|---|---|
| 2014/0097413 A1 | 4/2014 | Chen |
| 2015/0194629 A1* | 7/2015 | Liu ..................... H01L 51/5072 257/40 |
| 2016/0056218 A1 | 2/2016 | Wang et al. |
| 2016/0276615 A1 | 9/2016 | Kitabayashi |
| 2017/0104042 A1* | 4/2017 | Wang .................. H01L 27/3283 |
| 2017/0278914 A1 | 9/2017 | Cui et al. |
| 2018/0033842 A1 | 2/2018 | Bae et al. |

FOREIGN PATENT DOCUMENTS

| | | |
|---|---|---|
| CN | 104241329 A | 12/2014 |
| CN | 104638147 A | 5/2015 |
| CN | 105932037 A | 9/2016 |
| CN | 106067478 A | 11/2016 |
| CN | 107665905 A | 2/2018 |

OTHER PUBLICATIONS

"First Office Action and English language translation", CN Application No. 201810259260.9, dated Oct. 29, 2020, 15 pp.

* cited by examiner

DISPLAY SUBSTRATE, MANUFACTURING METHOD THEREOF, DISPLAY PANEL

RELATED APPLICATION

The present application is a 35 U.S.C. 371 national stage application of PCT International Application No. PCT/CN2018/119324, filed on Dec. 5, 2018, which claims the benefit of Chinese Patent Application No. 201810259260.9, filed on Mar. 27, 2018, the entire disclosure of which is incorporated herein by reference.

TECHNICAL FIELD

The present disclosure relates to the field of display technologies, and specifically to a display substrate, a display panel, and a method for manufacturing a display substrate.

BACKGROUND

In the process of fabricating the OLED devices of an organic light emitting diode (OLED) display panel, an inkjet printing process is generally employed. Fabricating an OLED display panel by means of the inkjet printing process involves spraying solutions of various materials such as a hole injection material into pixel pits on a base substrate which have been patterned successively using a micron-sized printing injection head, thereby forming layers of the OLED devices. This method can prevent waste of relatively expensive luminescent materials. Moreover, due to the injection head has a plurality of nozzles for printing, the time for fabricating the layers of the OLED devices can be greatly shortened. Therefore, the inkjet printing process has the advantages such as simple operation, low cost, and the like.

SUMMARY

The display substrate provided by an embodiment of the present disclosure comprises a base substrate and a pixel defining layer above the base substrate. The pixel defining layer comprises a first defining layer and a second defining layer on the first defining layer, the first defining layer defines a plurality of lower openings, the second defining layer defines a plurality of upper openings corresponding to the plurality of lower openings. An orthographic projection of a bottom surface of each of the plurality of the upper openings close to the first defining layer on the base substrate covers an orthographic projection of a corresponding lower opening on the base substrate, and orthographic projections of bottom surfaces of the plurality of upper openings close to the first defining layer on the base substrate have an equal area. The plurality of lower openings comprise a first lower opening, a second lower opening and a third lower opening, pixels of the display substrate comprise a first pixel, a second pixel and a third pixel. The first lower opening, the second lower opening and the third lower opening form a first cavity, a second cavity and a third cavity respectively together with a corresponding upper opening, for accommodating respective light emitting structure of the first pixel, the second pixel and the third pixel. An area of an orthographic projection of the third lower opening on the base substrate is different from an area of an orthographic projection of the first lower opening or the second lower opening on the base substrate.

In some embodiments, the first pixel, the second pixel, and the third pixel comprise an R pixel, a G pixel, and a B pixel, respectively, the area of the orthographic projection of the second lower opening in the second cavity on the base substrate is larger than the area of the orthographic projection of the first lower opening in the first cavity on the base substrate and smaller than the area of the orthographic projection of the third lower opening in the third cavity on the base substrate.

In some embodiments, respective lower opening and upper opening of each of the first cavity, the second cavity and the third cavity define a step formed by a material of the first defining layer, the lower opening transitions to the upper opening via the step.

In some embodiments, the light emitting structure comprises a hole injection layer, a hole transport layer, and an organic light emitting layer laminated in each cavity.

In some embodiments, a material for forming the first defining layer comprises at least one selected from a group consisting of silicon dioxide and silicon nitride, and a material for forming the second defining layer comprises polyimide.

In some embodiments, the light emitting structure of each pixel comprises a hole injection layer, the hole injection layer covers a surface of the first defining layer within a respective cavity, and respective hole injection layers in the first cavity, the second cavity and the third cavity have a substantially equal thickness. It can be understood that the hole injection layers having an equal thickness is mainly attributed to the pixel defining layer in the foregoing embodiments. When a solution of the hole injection layer material is sprayed into the first cavity, the second cavity, and the third cavity, since the volume of the lower opening of each cavity is small, the solution of the hole injection layer material may fill the lower opening of each cavity such that the solution extends over the bottom surface of the upper opening of each cavity. Moreover, the upper openings of the first cavity, the second cavity, and the third cavity have equal volumes and bottom surface areas, thus hole injection layers having the same thickness can be formed in the first cavity, the second cavity, and the third cavity. In addition, those skilled in the art can appreciate that "the hole injection layers having the same thicknesses" referred to herein indicates an ideal situation, which does not exclude a small difference in thicknesses of the hole injection layers in the first cavity, the second cavity, and the third cavity. The factors leading to the above difference in thicknesses may include: a difference in volumes of the lower openings in the first cavity, the second cavity, and the third cavity, a difference in volumes of the material solutions dropped into the cavities during inkjet printing, and a difference in bottom surface areas of the upper openings resulting from fabrication of the first cavity, the second cavity, and the third cavity. However, with the display substrate proposed by the embodiment of the present disclosure, even in the case where the volumes of the lower openings of the first cavity, the second cavity, and the third cavity are different from each other, it is easy to realize that the hole injection layers in the first cavity, the second cavity and the third cavity have a substantially equal thickness. In other words, the difference in thickness of the hole injection layers of respective pixels is significantly reduced compared to the existing display substrate.

In some embodiments, the light emitting structure further comprises an anode below the lower opening and in contact with the hole injection layer, and a cathode as a top structure of the light emitting structure.

In some embodiments, the upper openings of the first cavity, the second cavity and the third cavity have a same volume.

Another embodiment of the disclosure provides a display panel comprising the display substrate according to any one of the foregoing embodiments.

Yet another embodiment of the disclosure provides a method for manufacturing a display substrate, the method comprises fabricating the pixel defining layer as described in the above embodiments on a base substrate and forming a hole injection layer in the first cavity, the second cavity, and the third cavity by inkjet printing.

In some embodiments, a step of fabricating the pixel defining layer comprises: forming the first defining layer on the base substrate with a first material and forming the second defining layer above the first defining layer with a second material.

In some embodiments, fabricating the pixel defining layer comprises: forming a first film layer and a second film layer on the base substrate successively, and performing a patterning process to the first film layer and the second film layer to form the plurality of the lower openings in the first film layer and form the plurality of the upper openings in the second film layer, thereby obtaining the first defining layer and the second defining layer, respectively.

In some embodiments, a material for forming the first film layer comprises at least one selected from a group consisting of silicon dioxide and silicon nitride, and a material for forming the second film layer comprises polyimide.

In some embodiments, the first pixel, the second pixel, and the third pixel comprise an R pixel, a G pixel, and a B pixel, respectively, the area of the orthographic projection of the second lower opening in the second cavity on the base substrate is larger than the area of the orthographic projection of the first lower opening in the first cavity on the base substrate and smaller than the area of the orthographic projection of the third lower opening in the third cavity on the base substrate.

In some embodiments, a step of forming a hole injection layer in the first cavity, the second cavity, and the third cavity by inkjet printing comprises: controlling an inkjet printing apparatus such that a same amount of a solution of a hole injection layer material flows from each nozzle at a time; drying the solution of the hole injection layer material in the first cavity, the second cavity, and the third cavity to obtain hole injection layers having substantially the same thickness.

The above-described embodiments and technical features thereof may be combined in any manner to obtain new and different embodiments in the case of causing no contradiction or conflict. These embodiments are not to be construed as a departure from the spirit of the present disclosure, and fall within the protection scope of the present disclosure.

DETAILED DESCRIPTION OF EMBODIMENTS

Figure 1:
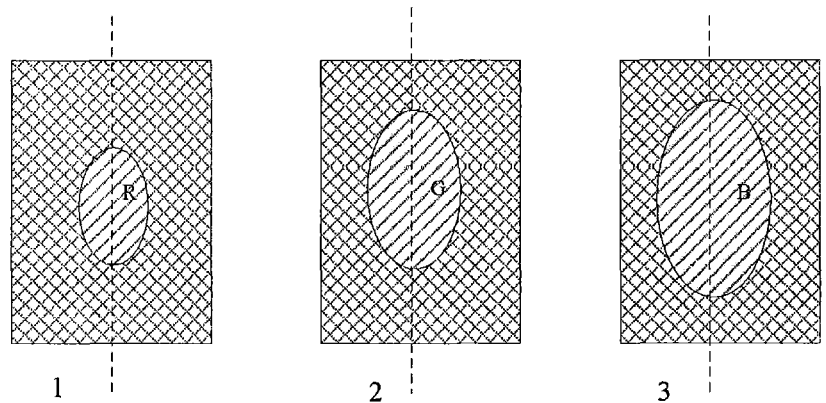
FIG. 1 illustrates a partial top view of a pixel defining layer in a display substrate provided by an embodiment of the present disclosure.

Specific embodiments of the disclosure are to be described in detail below by way of examples. It is to be understood that the embodiments of the present disclosure are not limited to the examples exemplified below, and those skilled in the art can make modifications and variations to the embodiments herein based on the principle or spirit of the disclosure to obtain other embodiments in different forms. These embodiments fall within the protection scope of the present application.

The inventors of the present application found in the process of fabricating an OLED display panel by an inkjet printing process that, there may be a great difference in thicknesses of the hole injection layers of the light emitting devices of respective pixels (e.g., red pixel R, green pixel G and blue pixel B), which is disadvantageous for improvement of the yield of mass-produced OLED display panels. Therefore, it is desirable that the hole injection layers in the OLED light emitting devices for respective pixels in an OLED display panel have an uniform thickness.

In order to realize that the OLED devices for the R, G and B pixels have hole injection layers of the same thickness, a suitable patterned pixel defining layer may be designed and fabricated, which may comprise pixel pits of the same size for accommodating the layer structures of the OLED devices (the "size" referred to herein refers to the bottom surface area of the pixel pit). Then, the material for the hole injection layer is sprayed into the pixel pit by an inkjet printing process. The parameters of the inkjet printing process can be adjusted, so that the amount of the material for the hole injection layer dropped into each pixel pit at a time is the same. In this way, hole injection layers for different pixels which have the same thickness can be obtained.

However, the inventors have recognized that, in the case where the pixel pits in the patterned pixel defining layer for accommodating the layer structures of the OLED devices for different pixels have the same size, the different pixels such as R, G and B pixels will have the same aperture ratio. However, different OLED devices corresponding to the R, G, B pixels comprise luminescent materials that emit different colors, and these luminescent materials emitting different colors have different properties, for example, they have different attenuation rates. During the operation of the OLED devices, the red luminescent material has the lowest attenuation rate, and the blue luminescent material has the highest attenuation rate, which may result in a serious color cast phenomenon during the operation of an OLED display panel. In view of this, it is problematic to design the pixel pits in the pixel defining layer for accommodating the layer structures of the OLED devices for different pixels to have the same size, and it is desirable to alleviate or avoid the resulting color cast phenomenon of the OLED display panel. Therefore, there seems to be a contradiction between obtaining hole injection layers for different pixels which have the same thickness and avoiding a color cast of the OLED display panel.

An embodiment of the present disclosure provides a display substrate to alleviate or avoid the color cast phenomenon occurring in the OLED display panel in operation, while enabling the OLED devices for different pixels to have hole injection layers of uniform thickness.

Hereinafter, embodiment of the display substrate will be described in detail by way of example with reference to the accompanying drawings. In the accompanying drawings, the pixel defining layer in the display substrate is mainly illustrated. The base substrate and other necessary components of the display substrate are well known to those skilled in the art, and therefore, for the sake of brevity, they are not shown in the drawings. It can be understood that the shapes of various elements shown in the drawings do not limit the specific shapes of corresponding features, and the dimensions of the various elements do not represent actual dimensions.

Figure 2:
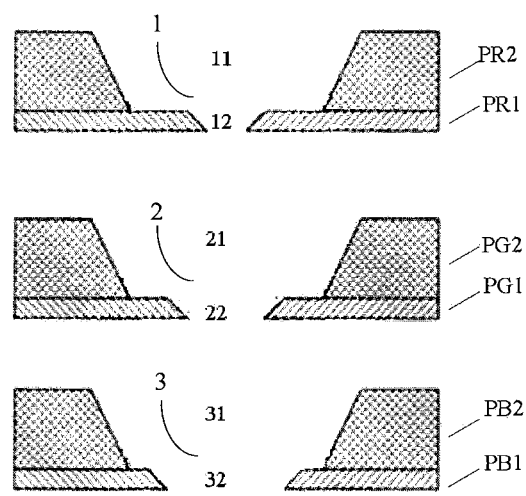
FIG. 2 illustrates a partial sectional view of a pixel defining layer taken along the dashed lines shown in FIG. 1.

The display substrate provided by an embodiment of the present disclosure comprises a base substrate and a pixel defining layer on the base substrate. FIG. 1 illustrates partial top views of a pixel defining layer of a display substrate provided by an embodiment of the present disclosure, and FIG. 2 illustrates partial sectional views of a pixel defining layer. As shown in FIGS. 1 and 2, the pixel defining layer comprises a first defining layer PR1, PG1, PB1 and a second defining layer PR2, PG2, PB2 above the first defining layer. The first defining layer PR1, PG1, PB1 defines a plurality of lower openings 12, 22, 32, and the second defining layer PR2, PG2, PB2 defines a plurality of upper openings 11, 21, 31 corresponding to the plurality of lower openings 12, 22, 32. The orthographic projections (i.e., the orthographic projections on the horizontal plane in FIG. 2) of the bottom surfaces of the upper openings 11, 21, 31 close to the first defining layer PR1, PG1, PB1 on the base substrate cover the orthographic projections of corresponding lower openings 12, 22, 32 on the base substrate, respectively. The orthographic projections of the bottom surfaces of the upper openings 11, 21, 31 close to the first defining layer PR1, PG1, PB1 on the base substrate have equal areas. The plurality of lower openings comprise a first lower opening 12, a second lower opening 22 and a third lower opening 32. Pixels of the display substrate comprise a first pixel, a second pixel and a third pixel. The first lower opening 12, the second lower opening 22 and the third lower opening 32 form a first cavity, a second cavity and a third cavity respectively with corresponding upper openings 11, 21, 31 for accommodating light emitting structures for the first pixel, the second pixel and the third pixel. Moreover, the area of the orthographic projection of the third lower opening 32 on the base substrate is different from the area of the orthographic projection of the first lower opening 12 or the second lower opening 22 on the base substrate.

As shown in FIG. 1, the pixel defining layer defines a first cavity 1, a second cavity 2 and a third cavity 3 for accommodating light emitting structures for the first pixel, the second pixel and the third pixel, respectively. The first pixel, the second pixel and the third pixel include, but are not limited to, a red pixel R, a green pixel G and a blue pixel B. As shown in FIG. 2, the first cavity 1, the second cavity 2, and the third cavity 3 each comprise a lower opening and an upper opening, and the size of the upper opening is larger than that of the lower opening to expose the lower opening. The upper openings 11, 21, 31 of the first cavity, the second cavity, and the third cavity are of the same size. The size of the upper opening or the size of the lower opening referred to herein mean the opening area of the upper opening or the lower opening, or can be understood as the area of the orthographic projection of the upper opening or the lower opening on the base substrate (horizontal plane). With the display substrate provided by the embodiment of the present disclosure, OLED devices for respective pixels of an OLED display panel can be fabricated by using an inkjet printing process. Specifically, the pixel defining layer may be formed on the base substrate, and then a solution of material for layers of the OLED light emitting structure is sprayed into the first cavity, the second cavity, and the third cavity. For example, when a solution of the material for the hole injection layer is sprayed into the first cavity, the second cavity, and the third cavity, since the volume of the lower opening of each cavity is relatively smaller, the solution of the material for the hole injection layer may fill the lower opening of each cavity so that the solution extends over the bottom surface of the upper opening of each cavity. When inkjet printing is being performed, it is easy to realize that the same amount of solution flows from each nozzle at a time. Moreover, the orthographic projections of the bottom surfaces of the upper openings 11, 21, 31 close to the first defining layer PR1, PG1, PB1 on the base substrate have equal areas, the upper openings 11, 21, 31 have the same volume, so hole injection layers having substantially the same thickness can be formed in the first cavity, the second cavity, and the third cavity. In other words, the difference in thickness of the hole injection layers of the OLED devices for respective pixels is significantly reduced. Further, in an embodiment, the depth of the lower opening in each cavity is smaller than the depth of the upper opening. For example, the depth of the lower opening is between 10 nm and 300 nm, e.g., 150 nm. The depth of the upper opening is between 50 and 500 nm, e.g., 300 nm. Thus, it is possible to minimize the unfavorable effect of different volumes of the lower openings 12, 22, 32 in the first cavity, the second cavity and the third cavity on the thickness uniformity of the hole injection layers in the first cavity, the second cavity and the third cavity, and even make the influence of different volumes of the lower openings in the first cavity, the second cavity and the third cavity on the thickness uniformity of the hole injection layers in the first cavity, the second cavity and the third cavity neglectable.

Therefore, with the display substrate provided by the embodiment of the disclosure, it is possible to enable the hole injection layers in the OLED devices for respective pixels to have substantially the same thickness. The manufacturing process is simple, and the yield of the mass-produced OLED display panels can be improved. Moreover, the areas of the orthographic projections of the lower openings in the first cavity, the second cavity and the third cavity on the base substrate are not completely the same, so the phenomenon that all the pixels have the same aperture ratio can be avoided, which is advantageous to alleviate or avoid a serious color cast occurring to the OLED display panel in operation.

Moreover, those skilled in the art can understand that it is an ideal situation that the upper openings 11, 21, 31 of the first cavity, the second cavity and the third cavity have the same volume, and embodiments of the present disclosure do not exclude errors between the volumes of the upper openings that are caused during the process of fabricating the first cavity, the second cavity and the third cavity. Moreover, those skilled in the art would also appreciate that the sectional shapes of the upper openings 11, 21, 31 and lower openings 12, 22, 32 shown in FIG. 2 are not intended to limit the present application. For example, unlike the upper openings and lower openings having sections similar to a trapezoid as shown in FIG. 2, in other embodiments, the first cavity, the second cavity and the third cavity may each have an upper opening and a lower opening having rectangular sections. The sectional shape of the upper openings and the lower openings in the first cavity, the second cavity and the third cavity is not limited in the present application. That is, the top views or the sectional views of the pixel defining layer in the drawings of the present application are used for illustrating relative positions and sizes of the first cavity, the second cavity and the third cavity, and do not actually limit the shapes of the cavities at all.

The first pixel, the second pixel and the third pixel may be pixels that display different colors, including but not limited to a red pixel R, a green pixel G, and a blue pixel B. In some embodiments, the first pixel is an R pixel, the second pixel is a G pixel, and the third pixel is a B pixel. In this case, the area of the orthographic projection of the second lower opening 22 in the second cavity 2 on the base substrate is larger than the area of the orthographic projection of the first lower opening 12 in the first cavity 1 on the base substrate and smaller than the area of the orthographic projection of the third lower opening 32 in the third cavity 3 on the base substrate. As shown in FIG. 2, the lower openings have approximately the same depth, but the size of the lower opening 12 in the first cavity corresponding to the R pixel is small, the size of the lower opening 32 in the third cavity corresponding to the B pixel is the large, and the size of the lower opening 33 in the second cavity corresponding to the G pixel is of an intermediate value. The inventors of the present application have recognized that, during the operation of an OLED device, the red luminescent material has the slowest attenuation rate, the blue luminescent material has the fastest attenuation rate, and the green luminescent material has a medium attenuation rate. By making the size of the lower opening 22 in the second cavity larger than the size of the lower opening 12 in the first cavity and smaller than the size of the lower opening 32 in the third cavity, the R pixel has a minimum aperture ratio, the B pixel has a maximum aperture ratio, and the G pixel unit has an aperture ratio between that of the R pixel and that of the B pixel. This is advantageous to reduce the difference between the attenuation states of the luminescent materials in the pixels of different colors during the operation of the OLED display panel, thereby alleviating or avoiding a color cast occurring to the OLED display panel in operation. Further, as described above, the orthographic projections of the bottom surfaces of the upper openings of the cavities close to the first defining layer on the base substrate have equal areas, that is, the upper openings of the respective cavities have substantially the same volume. Thus, in such an embodiment, the volume of the second cavity may be considered to be larger than the volume of the first cavity and smaller than the volume of the third cavity.

In the embodiment shown in FIG. 2, the lower opening and the upper opening in each cavity together define a step formed by the material of the first defining layer, and the lower opening transitions to the upper opening via the step. Since the size of the lower opening in each cavity is smaller, when the hole injection layer is being fabricated by an inkjet printing process, the solution of the hole injection layer material may fill the lower opening and covers the step in each cavity, so that the solution covers the bottom surface of the upper opening in each cavity to form the hole injection layer.

Figure 3:
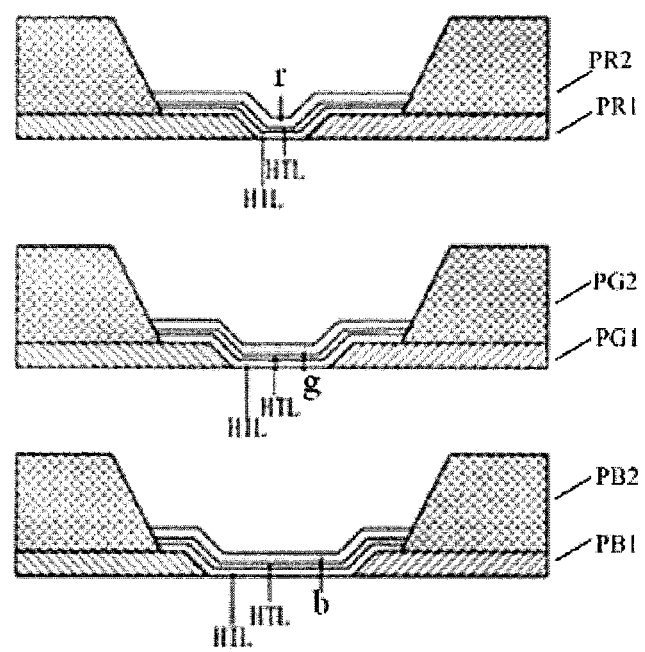
FIG. 3 schematically shows part of the light emitting structure of an OLED device formed by an inkjet printing process in the pixel defining layer illustrated in FIG. 2.

FIG. 3 schematically shows part of the light emitting structure of an OLED device formed in the pixel defining layer shown in FIG. 2 by means of an inkjet printing process. As shown in FIG. 3, a hole injection layer (HIL), a hole transport layer (HTL), and an organic light emitting layer r, g or b are formed successively by an inkjet printing process in the first cavity, the second cavity, and the third cavity. Of course, the light emitting structure of the OLED device further comprises other elements, such as an electron transport layer, an electron injection layer, and the like, which will not be described in detail herein.

Through the above description, it can be understood that the pixel defining layer proposed by the embodiments of the present disclosure is a patterned layer structure. In an embodiment, the pixel defining layer comprises a first defining layer and a second defining layer above the first defining layer. The first defining layer and the second defining layer are also patterned layers, as shown in FIG. 2 or FIG. 3.

In an embodiment, the material for forming the first defining layer may comprise a hydrophilic inorganic material, for example, including but not limited to, silicon dioxide, silicon nitride, and the like. The material for forming the second defined layer may comprise a hydrophobic organic material, for example, including but not limited to, polyimide and the like. Thus, the material of the hole injection layer can be stably attached to the lower openings of the first cavity, the second cavity, and the third cavity while being less likely to overflow from the upper openings of the cavities.

As described above, the hole injection layer can be formed in each cavity of the pixel defining layer by an inkjet printing process. Since the upper openings of the first cavity, the second cavity and the third cavity in the pixel defining layer have the same volume, it is easy to form hole injection layers having substantially the same thickness in the first cavity, the second cavity and the third cavity. Therefore, for the display substrate provided by an embodiment of the present disclosure, the light emitting structure of each pixel comprises a hole injection layer that covers the surface of the first defining layer within each cavity, and the hole injection layers have substantially the same thickness.

Further, in an embodiment, the light emitting structure of each pixel further comprises an anode below the lower opening and in contact with the hole injection layer, and a cathode as a top layer of the light emitting structure. The anode may be in contact with an electron injection layer of the light emitting structure. In case a voltage is applied to the cathode and the anode of the OLED device, luminescence of the OLED device can be achieved.

Another embodiment of the present disclosure provides a display panel, which may comprise the display substrate as described in any of the foregoing embodiments.

According to a further embodiment of the present disclosure, there is provided a method for manufacturing a display substrate. The method comprises the following steps: fabricating a pixel defining layer on a base substrate, the specific structure of the pixel defining layer can be referred to the foregoing embodiments; forming a hole injection layer in the first cavity, the second cavity, and the third cavity in the pixel defining layer by inkjet printing. Since the volumes (sizes) of the upper openings of the first cavity, the second cavity, and the third cavity are the same, hole injection layers having substantially the same thickness can be formed in the first cavity, the second cavity, and the third cavity during the process of inkjet printing. This is very advantageous for improvement of the yield of mass-produced OLED display panels, and the manufacturing process is simple.

According to an embodiment of the present disclosure, the pixel defining layer may comprise a first defining layer and a second defining layer above the first defining layer. In some embodiments, the first defining layer and the second defining layer are formed of the same material. For example, they can be made of the same transparent material. Alternatively, in further embodiments, the first defining layer and the second defining layer may be formed of different transparent materials. For example, in fabricating the pixel defining layer, the first defining layer is formed on the base substrate using a first material, and the second defining layer is then formed above the first defining layer using a second material. Specifically, according to an embodiment of the present disclosure, fabricating the pixel defining layer may comprise the steps of forming a first film layer and a second film layer on the base substrate successively, and performing a patterning process to the first film layer and the second film layer to form a plurality of the lower openings in the first film layer to obtain the first defining layer, and to form a plurality of the upper openings in the second film layer to obtain the second defining layer, respectively. The upper openings and the lower openings in the pixel defining layer mentioned in the embodiments of the present disclosure may be formed by any process known to those skilled in the art, which is not limited in the present application.

The depth of the lower opening in each cavity is smaller than the depth of the upper opening so as to minimize the unfavorable effect of different sizes of the lower openings of the first cavity, the second cavity and the third cavity on the thickness uniformity of the hole injection layers in the first cavity, the second cavity and the third cavity. Therefore, in the embodiments, the thickness of the first film layer is smaller than the thickness of the second film layer. For example, the thickness of the first film layer for forming the first defining layer is between 10 nm and 300 nm, and the thickness of the second film layer for forming the second defining layer is between 50 nm and 500 nm. According to an embodiment of the disclosure, the material for forming the first film layer comprises either of silicon dioxide and silicon nitride, and the material for forming the second film layer comprises polyimide.

Alternatively, fabricating the pixel defining layer may comprise the step as follows: forming a first film layer and a second film layer on the base substrate successively, and performing a patterning process to the first film layer and the second film layer to form lower openings of the first cavity, the second cavity, and the third cavity in the first film layer, and to form upper openings of the first cavity, the second cavity, and the third cavity in the second film layer. That is, in this embodiment, firstly, a first film layer and a second film layer that are not patterned are formed on the base substrate (the materials of the first film layer and the second film layer may be the same or different); then, lower openings and upper openings of the cavities for the pixels are formed by a patterning process such as etching, thereby forming a first cavity, a second cavity, and a third cavity.

In an embodiment, the first cavity, the second cavity, and the third cavity are configured to accommodate light emitting structures for the first pixel, the second pixel, and the third pixel, respectively. The first pixel, the second pixel, and the third pixel are an R pixel, a G pixel, and a B pixel, respectively. The area of the orthographic projection of the second lower opening of the second cavity on the base substrate is larger than the area of the orthographic projection of the first lower opening of the first cavity on the base substrate and smaller than the area of the orthographic projection of the third lower opening of the third cavity on the base substrate. This may be advantageous to reduce the difference between the attenuation states of the luminescent materials in the pixels of different colors during the operation of an OLED display panel, thereby alleviating or avoiding a color cast occurring in the OLED display panel in operation.

According to some embodiments of the present disclosure, forming a hole injection layer in the first cavity, the second cavity, and the third cavity by inkjet printing may comprise the following steps: controlling an inkjet printing apparatus such that the same amount of the solution of material for the hole injection layer flows from each nozzle at a time; drying the solution of material for the hole injection layer in the first cavity, the second cavity, and the third cavity to obtain hole injection layers having substantially the same thickness. The inkjet printing apparatus is controlled such that the same amount of the solution of the hole injection layer material flows from each nozzle at a time, which is advantageous to further make the thicknesses of the finally formed hole injection layers uniform.

What have been described above are some exemplary embodiments of the disclosure. However, those skilled in the art when practicing the claimed subject matter can understand and implement other variations of the disclosed embodiments based on the study of the drawings, the disclosure and the claims. In the claims, the word "comprise" does not exclude the presence of other elements, and the claims do not limit the number of technical features recited. Although some features are recited in different dependent claims, the present application is also intended to encompass embodiments in which these features are combined.

The invention claimed is:

1. A display substrate comprising:
a base substrate; and
a pixel defining layer on the base substrate,
wherein the pixel defining layer comprises a first defining layer and a second defining layer on the first defining layer,
wherein the first defining layer defines a plurality of lower openings,
wherein the second defining layer defines a plurality of upper openings corresponding to the plurality of lower openings,
wherein respective orthographic projections of respective bottom surfaces of ones of the plurality of the upper openings adjacent the first defining layer on the base substrate overlap respective orthographic projections of corresponding lower openings on the base substrate,
wherein the respective orthographic projections of the respective bottom surfaces of the ones of the plurality of upper openings have equal respective areas,
wherein the plurality of lower openings comprise a first lower opening, a second lower opening and a third lower opening, and of the display substrate comprise a first pixel, a second pixel and a third pixel,
wherein the first lower opening, the second lower opening and the third lower opening form a first cavity, a second cavity and a third cavity respectively together with a corresponding upper opening of the plurality of upper openings for accommodating respective light emitting structures of the first pixel, the second pixel and the third pixel, and
wherein an area of an orthographic projection of the third lower opening on the base substrate is different from an area of an orthographic projection of the first lower opening on the base substrate or an orthographic projection of the second lower opening on the base substrate,
wherein respective lower openings and respective upper openings of each of the first cavity, the second cavity and the third cavity define a step formed by a material of the first defining layer, and
wherein the respective lower openings transition to the respective upper openings via the step,
wherein the respective light emitting structures of the first pixel, the second pixel and the third pixel comprise respective hole injection layers,
wherein the respective hole injection layers cover an upper surface of the first defining layer within a corresponding first cavity, second cavity, or third cavity, and wherein respective hole injection layers in the first cavity, the second cavity and the third cavity have a substantially equal thickness.

2. The display substrate according to claim 1, wherein ones of the light emitting structures comprise a hole injection layer, a hole transport layer, and an organic light emitting layer laminated in a corresponding first cavity, second cavity, or third cavity.

3. The display substrate according to claim 1,
wherein a material of the first defining layer comprises at least one selected from silicon dioxide or silicon nitride, and
wherein a material of the second defining layer comprises polyimide.

4. The display substrate according to claim 1, wherein the respective light emitting structures further comprise a respective anode below a respective one of the plurality of lower openings and in contact with the respective hole injection layers, and a respective cathode as a corresponding top structure of the respective light emitting structures.

5. The display substrate according to claim 1, wherein corresponding ones of the plurality of the upper openings of the first cavity, the second cavity and the third cavity have a same volume.

6. A display panel comprising the display substrate according to claim 1.

7. A method for manufacturing a display substrate, comprising:
fabricating the pixel defining layer of claim 1 on the base substrate; and
forming respective hole injection layers in the first cavity, the second cavity, and the third cavity by inkjet printing.

8. The method according to claim 7, wherein the fabricating the pixel defining layer comprises:
forming the first defining layer on the base substrate with a first material; and
forming the second defining layer on the first defining layer with a second material.

9. The method according to claim 7, wherein the fabricating the pixel defining layer comprises:
forming a first film layer and a second film layer on the base substrate successively, and
performing a patterning process on the first film layer and the second film layer to form the plurality of the lower openings in the first film layer and form the plurality of the upper openings in the second film layer, thereby obtaining the first defining layer and the second defining layer, respectively.

10. The method according to claim 9,
wherein a material for forming the first film layer comprises at least one material selected from silicon dioxide or silicon nitride, and
wherein a material for forming the second film layer comprises polyimide.

11. The method according to claim 7,
wherein the first pixel, the second pixel, and the third pixel comprise an R pixel, a G pixel, and a B pixel, respectively,
wherein the area of the orthographic projection of the second lower opening in the second cavity on the base substrate is greater than the area of the orthographic projection of the first lower opening in the first cavity on the base substrate and less than the area of the orthographic projection of the third lower opening in the third cavity on the base substrate.

12. The method according to claim 7, wherein the forming respective hole injection layers in the first cavity, the second cavity, and the third cavity by inkjet printing comprises:
controlling an inkjet printing apparatus such that a same amount of a solution of a hole injection layer material flows from each nozzle at a time; and
drying the solution of the hole injection layer material in the first cavity, the second cavity, and the third cavity to obtain hole injection layers having substantially a same thickness.

13. The method according to claim 7, wherein corresponding ones of the plurality of the upper openings of the first cavity, the second cavity and the third cavity have a same volume.

14. A display substrate comprising:
a base substrate; and
a pixel defining layer on the base substrate,
wherein the pixel defining layer comprises a first defining layer and a second defining layer on the first defining layer,
wherein the first defining layer defines a plurality of lower openings,
wherein the second defining layer defines a plurality of upper openings corresponding to the plurality of lower openings,
wherein respective orthographic projections of respective bottom surfaces of ones of the plurality of the upper openings adjacent the first defining layer on the base substrate overlap respective orthographic projections of corresponding lower openings on the base substrate,
wherein the respective orthographic projections of the respective bottom surfaces of the ones of the plurality of upper openings have equal respective areas,
wherein the plurality of lower openings comprise a first lower opening, a second lower opening and a third lower opening, and the display substrate comprise a first pixel, a second pixel and a third pixel,
wherein the first lower opening, the second lower opening and the third lower opening form a first cavity, a second cavity and a third cavity respectively together with a corresponding upper opening of the plurality of upper openings for accommodating respective light emitting structures of the first pixel, the second pixel and the third pixel, and
wherein an area of an orthographic projection of the third lower opening on the base substrate is different from an area of an orthographic projection of the first lower opening on the base substrate or an orthographic projection of the second lower opening on the base substrate,
wherein the first pixel, the second pixel, and the third pixel comprise an R pixel, a G pixel, and a B pixel, respectively,
wherein the area of the orthographic projection of the second lower opening in the second cavity on the base substrate is greater than the area of the orthographic projection of the first lower opening in the first cavity on the base substrate and less than the area of the orthographic projection of the third lower opening in the third cavity on the base substrate.

15. The display substrate according to claim 14,
wherein respective lower openings and respective upper openings of each of the first cavity, the second cavity and the third cavity define a step formed by a material of the first defining layer, and
wherein the respective lower openings transition to the respective upper openings via the step.

* * * * *